(12) United States Patent
Dike (10) Patent No.: US 6,642,763 B2
(45) Date of Patent: Nov. 4, 2003

(54) LONG SETUP FLIP-FLOP FOR IMPROVED SYNCHRONIZATION CAPABILITIES

(75) Inventor: Charles E. Dike, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/034,081

(22) Filed: Dec. 19, 2001

(65) Prior Publication Data

US 2003/0112047 A1 Jun. 19, 2003

(51) Int. Cl.$^7$ ................................................ H03K 3/289
(52) U.S. Cl. ........................................ 327/202; 327/198
(58) Field of Search ............................... 327/198, 202, 327/203, 52, 55, 57

(56) References Cited

U.S. PATENT DOCUMENTS

| | | | | |
|---|---|---|---|---|
| 4,591,737 A | * | 5/1986 | Campbell | 327/198 |
| 4,929,850 A | * | 5/1990 | Breuninger | 327/198 |
| 4,963,772 A | * | 10/1990 | Dike | 327/198 |
| 4,999,528 A | * | 3/1991 | Keech | 327/198 |
| 5,418,407 A | * | 5/1995 | Frenkil | 327/141 |
| 5,485,112 A | * | 1/1996 | Greenberg et al. | 327/198 |
| 6,208,188 B1 | * | 3/2001 | Shionoya | 327/215 |

OTHER PUBLICATIONS

D.J. Kinniment, A, Bystrov, and A.V. Yakovlev, "Synchronization Circuit Performance", IEEE JofSSC, Feb. 2002, vol. 37, No. 2, pp. 202–209.

* cited by examiner

*Primary Examiner*—Toan Tran
(74) *Attorney, Agent, or Firm*—Kenyon & Kenyon (57) ABSTRACT

A device and method for improving the synchronization and metastability resolving capabilities of a flip flop. At least one master latch resolves a metastable condition of a received data signal thereby generating a stable data signal which is received and then displayed by a slave latch. Latches with superior metastability time resolution are configured in a master-slave relationship along with a novel clocking scheme whereby the clock signal supplied to the master latch is inverted as compared to that which is supplied to slave latch. As a result, the input data is latched on a falling edge of a clock signal and subsequently displayed on the rising edge of the clock signal providing at one half cycle for the input data to settle before passing out the data thereby allowing metastabilities to resolve during that period.

26 Claims, 5 Drawing Sheets

LONG SETUP FLIP-FLOP FOR IMPROVED SYNCHRONIZATION CAPABILITIES

FIELD OF THE INVENTION

This invention relates to a digital circuitry and logic design. In particular, the present invention provides a long setup flip-flop with improved synchronization and metastability resolving capabilities.

BACKGROUND INFORMATION

In the communication between digital subsystems that do not share a common time reference, signals may occur which are not stable. When this occurs a problem condition may arise where resolution to a logically defined state within a bounded period of time does not occur. The inability for a digital circuit to settle within a bounded period of time is commonly referred to as metastability and may lead to processing errors if not properly synchronized.

Metastability is an increasingly significant problem for digital circuit design, particularly as clock rates increase. In addition to posing potential disorders in asynchronous systems, metastability can be a problem in synchronous systems where the data input is not kept stable during the setup and hold-time constraints of a flip-flop.

A flip-flop is a bistable device, i.e. it has two stable states: "0" and "1" (also referred to as "low" and "high"). Under certain conditions, the flip-flop may enter a metastable state where node voltages remain near the threshold level. In this case, node voltages may not resolve to a logically defined state and where they may remain so for an indeterminate amount of time.

In particular, a metastable state may be induced in an edged-triggered device, for example, with the simultaneous arrival of data during a sampling period. In an edge-triggered device, the input data signal is captured only during the very short time when the clock is changing (i.e. during the "edge" of the clock pulse). If the input signal changes during a clock edge it is possible to enter a metastable condition. In this instance, the flip-flop device may become unable to resolve to either a 0 or a 1 thereby requiring a prolonged period waiting period for the metastability to resolve. Typically, noise (switching and/or thermal) or a slight imbalance eventually causes resolution to occur. However, prior to resolution of this imbalance, the interpretation of the metastable signal may cause a synchronization failure where the undefined value is sampled by other digital circuitry and propagates through the system causing system failures and/or malfunctions.

Once the flip-flop enters a metastable state, the probability that it will remain metastable some time later has been shown to be an exponentially decreasing function which determines the mean time between failure (MTBF):

$$MTBF = \frac{e^{\frac{t}{\tau_r}}}{T_w f_c f_d}$$

where t is the time by which the device must be resolved (the metastability settling time), $\tau_r$ is the exponential decay rate indicating how long a device is expected to remain in a metastable state once placed there (the metastability time resolution constant), $T_w$ is the likelihood of entering a metastable state (window of metastability propensity), $f_c$ is the frequency of the clock, and $f_d$ is the frequency of the data. It is desirable to maximize MTBF. This becomes increasingly difficult as the clock frequency $f_c$ increases.

Figure 1:
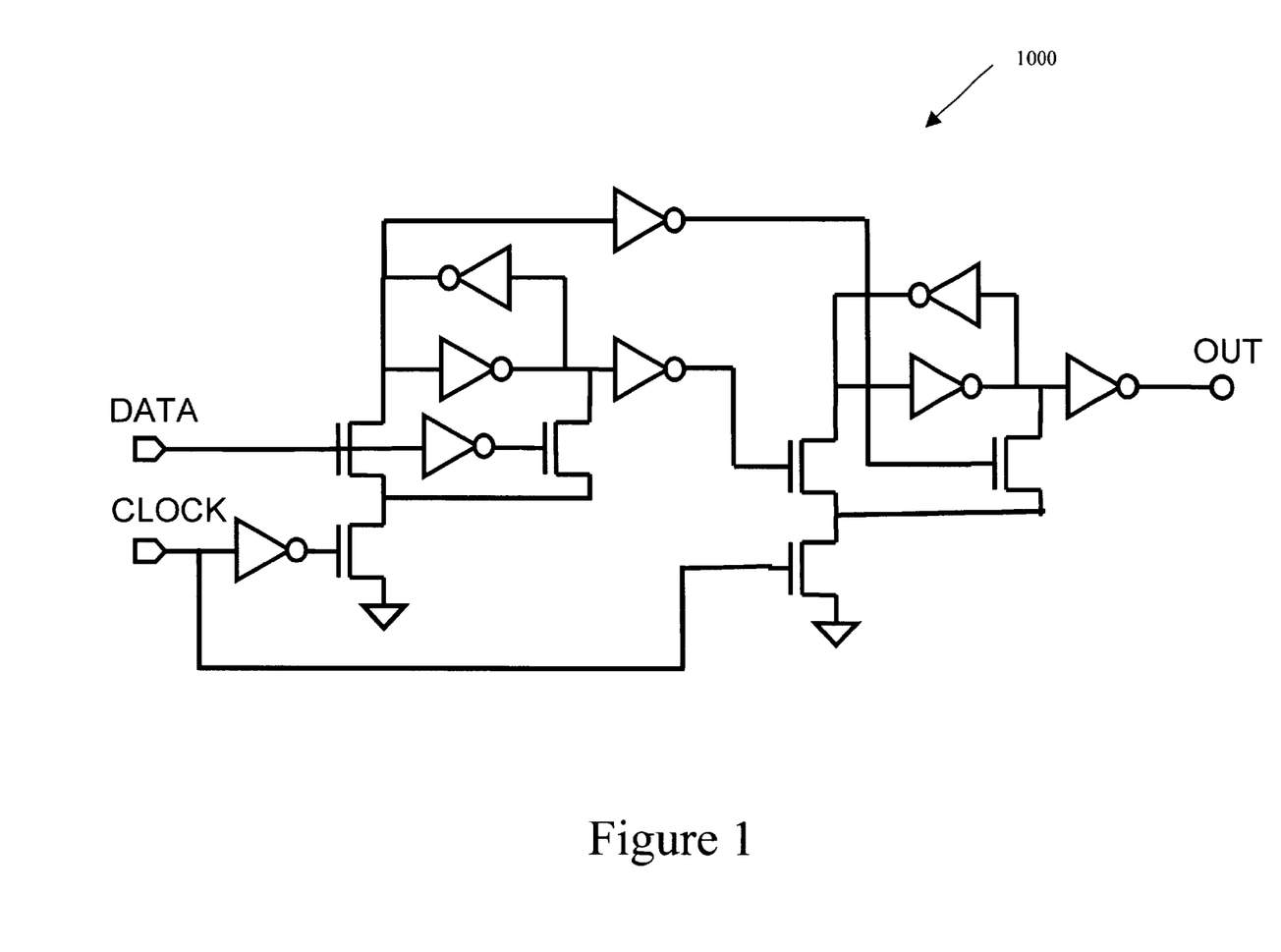
FIG. 1 shows a synchronizer circuit utilizing two cross-coupled CMOS inverters.

In order to reduce the problems caused by metastability and thereby improve MTBF, circuits called synchronizers are utilized to resolve the undefined signal to be either in the low or high state before it is sampled by other digital circuitry. Typically, synchronizers utilize a latching element that holds data while metastabilities are being resolved. Often synchronizers utilize two cross-coupled CMOS inverters back-to-back, as depicted in circuit 1000 of FIG. 1, which employ a regenerative configuration with positive feedback to capture and retain the input data. Such an arrangement allows a whole clock cycle to resolve metastability. Multiple synchronizers may be cascaded to improve the metastability resolving characteristics of the circuit but at the cost of increased latency, i.e. a full clock period of latency for each additional synchronizer.

DETAILED DESCRIPTION

The present invention provides a synchronizer that employs a long setup approach with superior metastability resolution capability to reduce latency by as much as one half period per clock cycle as compared with conventional synchronizers. Such reduced latency results in higher performance with a lower failure rate.

Figure 2A:
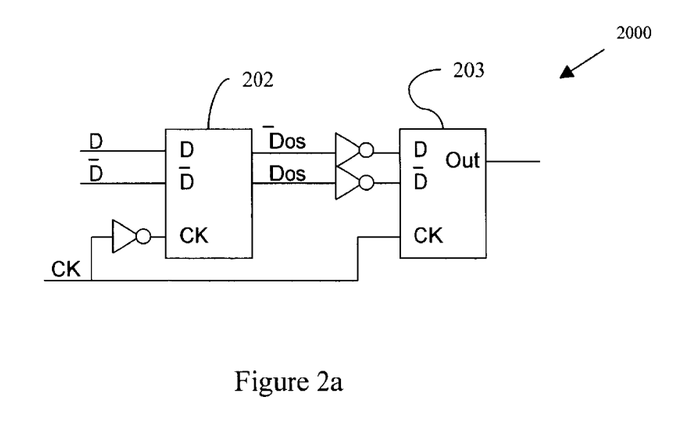
FIGS. 2a and 2b shows an exemplary embodiment of the synchronizer according present invention utilizing a master latch, slave latch, and novel clocking scheme design.

As illustrated in FIG. 2a, synchronizer 2000 according to the present invention includes master latch 202 connected in series with slave latch 203. According to one embodiment, master latch 202 is configured in a precharge configuration. Clock signal CK is supplied to master latch 202 and its complement supplied to slave latch 203. Input data D is latched on the falling edge of the clock signal CK and subsequently displayed on the rising edge of clock signal CK providing a full half cycle for input data D to settle before passing the data out to slave latch 203 allowing any metastabilities to resolve during that period. To increase this settling period, clock signal CK may be pulsed at a duration less than a 50% duty cycle. This allows the input data D to be captured in master latch 202 for an extended time period greater than a half cycle extending the time period in which mestabilities may be resolved. If the corresponding MTBF of master latch 202 is sufficient, then slave latch 203 functions as a buffer element. This simplifies the design and reduces restrictions on output timing. According to one embodiment, master latch 202 may be a sense amp latch incorporating a differential amplifier design and slave latch 203 may be a cross-coupled inverter latch commonly called a "jam latch"or, alternatively, slave latch 203 may be a tristateable latch. The sense amp latch is preferred because it possesses a superior metastability time resolution as compared to other latches enabling master latch 202 to resolve quickly and return to a precharge state when it is not latched. (Alternatively, of course, the master latch may return to a pre-discharge state) Although other transparent latches may be utilized for slave latch 203, the jam latch is preferred because it is capable of storing data through both clock cycles as well as having a superior metastability time resolution as compared with other transparent latches (the tristateable latch would have a faster clock to output time but less superior metastability time resolution as compared with the jam latch). The combination of device elements with superior metastability time resolution and a novel clocking scheme produces a synchronizer with an improved MTBF without decreasing clock frequency.

Figure 2B:
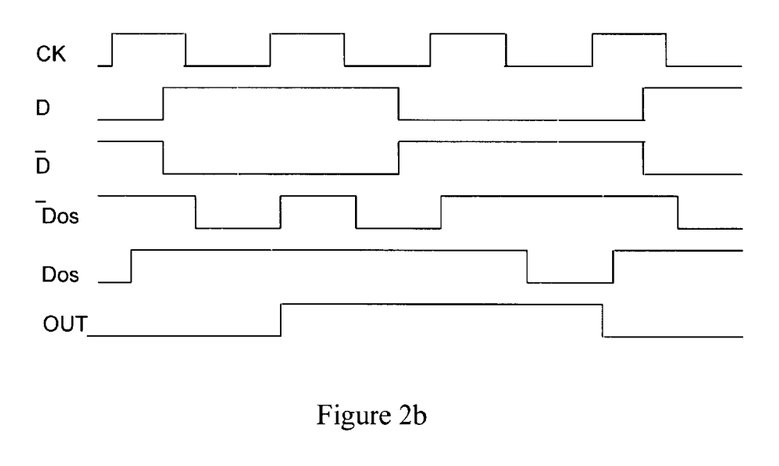

FIG. 2b illustrates a timing diagram for the embodiment of FIG. 2a. Clock signal CK is generated at a regular interval, data signal D is supplied to master latch 202, data output signal Dos represents the precharging characteristic of master latch 202, and output signal OUT is produced by slave latch 203. A comparison of signal transitions shows data signal D captured on a falling edge of clock signal CK and then subsequently displayed on the next rising edge of clock signal CK. In particular, as data signal D transitions from a low to high value prior to a falling edge of the clock signal CK, output signal OUT remains low prior to the following rising edge of clock signal CK. As clock signal CK rises, output signal OUT transitions from a low to high value thereby demonstrating the extended metastability resolution time.

Figure 3:
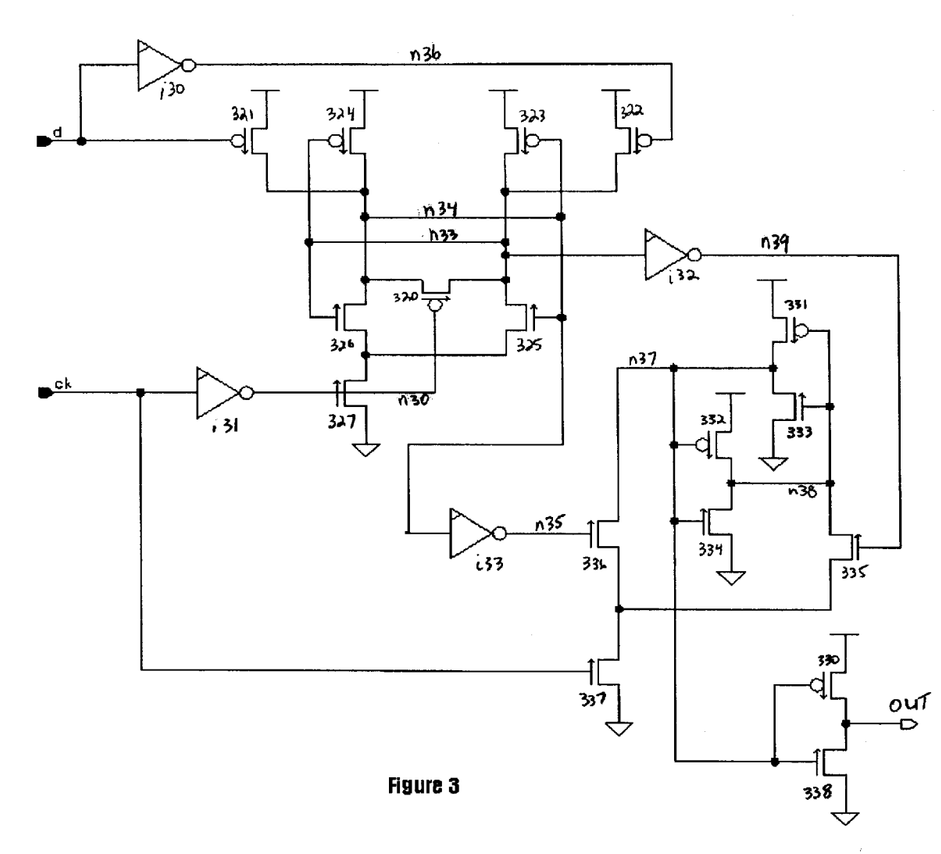
FIG. 3 shows an exemplary embodiment of the present invention utilizing a sense amp latch as the master latch and a jam latch as the slave latch.

FIG. 3 is a transistor level diagram illustrating an exemplary embodiment of the present invention utilizing the sense amp latch, jam latch, and novel clocking scheme design. Sense amp latch (SAL) is comprised of PMOS transistors 320–324 and NMOS transistors 325–327. More precisely, transistors 323 through 326 form two cross-coupled inverters providing a latching function to capture input data signal d, transistors 321 and 322 ensure that input data signal d and its inverted value appearing on node n36 via inverter i30 are properly supplied to the cross-coupled inverters, while transistors 320 and 327 operate to sense a differential across outputs nodes n33 and n34 of the two cross-coupled inverters. The jam latch is comprised of PMOS transistors 330–332 and NMOS transistors 333–338. In particular, transistors 331 through 334 from two cross-coupled inverters providing a latching function to store data transferred from the SAL, transistors 335 and 336 ensure that the transferred data is properly supplied to the cross-coupled inverters, transistors 330 and 338 form an inverter presenting an output OUT, while transistor 337 receives clock signal ck in order to facilitate the timing of the latching function and presentation of output OUT. Clock signal ck is further supplied to the SAL in an inverted form via inverter i31. As such, input data signal d is latched on the falling edge of clock signal ck and then subsequently displayed on the rising edge of clock signal ck. A detailed description of the present invention exhibiting this behavior during the pertinent clock phases is described below.

With clock signal ck high, inverter i31 forces node n30 to a low potential causing transistor 320 to turn on, which forms a short circuit between nodes n33 and n34. The low potential of node n30 also causes transistor 327 to turn off which removes a path to ground so neither transistor 325 nor transistor 326 will conduct. As a result, nodes n33 and n34 are allowed to float high with the incoming input data signal d. Upon input data signal d going high, transistor 321 will turn off and inverter i30 will force node n36 low causing transistor 322 to turn on thereby pulling node n33 high which causes transistor 324 to turn off and transistor 326 to turn on. Likewise upon input data signal d going low, transistor 322 will turn off and transistor 321 will turn on thereby pulling node n34 high which causes transistor 323 to turn off and transistor 325 to turn on. Thus, precharging occurs in the SAL when clock signal ck is high.

When clock signal ck goes low, inverter i31 forces node n30 high causing transistor 327 to turn on and transistor 320 to turn off. With transistor 320 off, the short circuit between nodes n33 and n34 is removed enabling the nodes to be differentiated depending upon the current value of input data signal d. If data input signal d is currently high, node n34 is pulled low via transistors 327 and 326 which cause transistor 325 to turn off thereby allowing node n33 to remain high. Likewise, if input data input signal d is currently low, node n33 is pulled low via transistors 327 and 325 which cause transistor 326 to turn off thereby allowing node n34 to remain high. Hence, as clock signal goes low, a differential is formed across output nodes n33 and n34 in the cross-couple inverter circuitry of the SAL whereby a state of node n33 high and node n34 low represents a latched data value high and a state of node n33 low and node n34 high represents a latched data value low. This differential is driven to the jam latch via inverters i32 and i33 which deliver the inverted values of nodes n33 and n34 to transistors 335 and 336 via nodes n39 and n35 respectively. However, with transistor 337 turned off when clock signal is low, transistors 335 and 336 do not conduct thereby preserving the previously stored value in the jam latch circuitry. Thus, as long as clock signal ck remains low, transparency of data between the SAL and the jam latch is delayed, and metastabilities of the latched data in the SAL may continue to be resolved.

As clock signal ck rises again, transistor 337 is turned on permitting the jam latch to receive latched data from the SAL. If the SAL has latched a high data value (n34 low and n33 high), inverters i32 and i33 drive nodes n35 and n39 high and low respectively, causing transistor 336 to turn on and transistor 335 to remain off. With transistors 337 and 336 turned on, node n37 is pulled low causing transistor 332 to turn on and transistor 334 to turn off thereby pulling node n38 high which turns transistor 331 off and transistor 333 on thereby holding node n37 low. Likewise, if the SAL has latched a low data value (n33 low and n34 high), inverters i32 and i33 cause nodes n39 and n35 to go high and low respectively, which causes transistors 335 to turn on and transistor 336 to turn off. With transistors 337 and 335 on, node n38 is pulled low causing transistor 331 to turn on and transistor 333 to turn off thereby pulling node n37 high which turns transistor 332 off and transistor 334 on thereby holding node n38 low. Hence, with holding either node n37 or n38 low while the other node is high, transferred data is latched in the jam latch and presented on output OUT via transistors 330 and 338. With the data presented on output OUT upon the high clock signal, a full half cycle following the capture of data by the SAL, metastabilities are allowed to resolve during this extended period.

Figure 4:
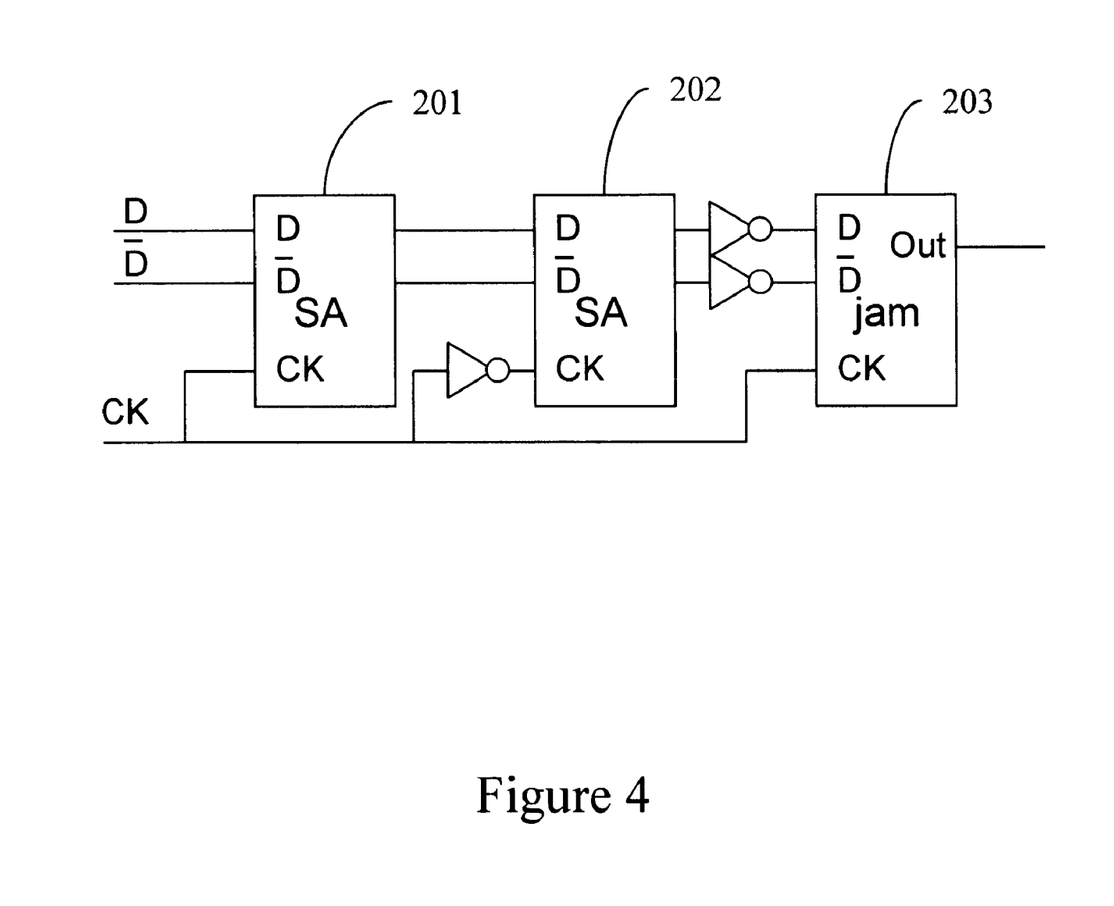
FIG. 4 show an exemplary embodiment of the present invention utilizing an additional sense amp latch.

The synchronization and metastability resolving characteristics may be further improved with the addition of one or more master latches. FIG. 4 shows an exemplary embodiment of the present invention including an additional master latch (e.g. a sense amp latch) connected in series with the previously described embodiment. Such a configuration improves synchronization and metastability resolution characteristics by utilizing a rising phase of the clock to capture data described below.

Upon a rising edge of clock signal CK, the value of input data signal D is latched into first master latch 201 and the data of second master latch 202 is latched in slave latch 203. Upon a falling edge of clock signal CK, slave latch 203 retains the previously clocked data while the current data is transferred from first master latch 201 to second master latch 202. With clock signal CK low, first master latch 201 enters a pre-charge state enabling the device to resolve metastabilities for an additional one half clock cycle as compared to the device of FIG. 2a. Thus, the addition of further master latch 201 allows the device one complete clock cycle to resolve metastabilities.

Figure 5:
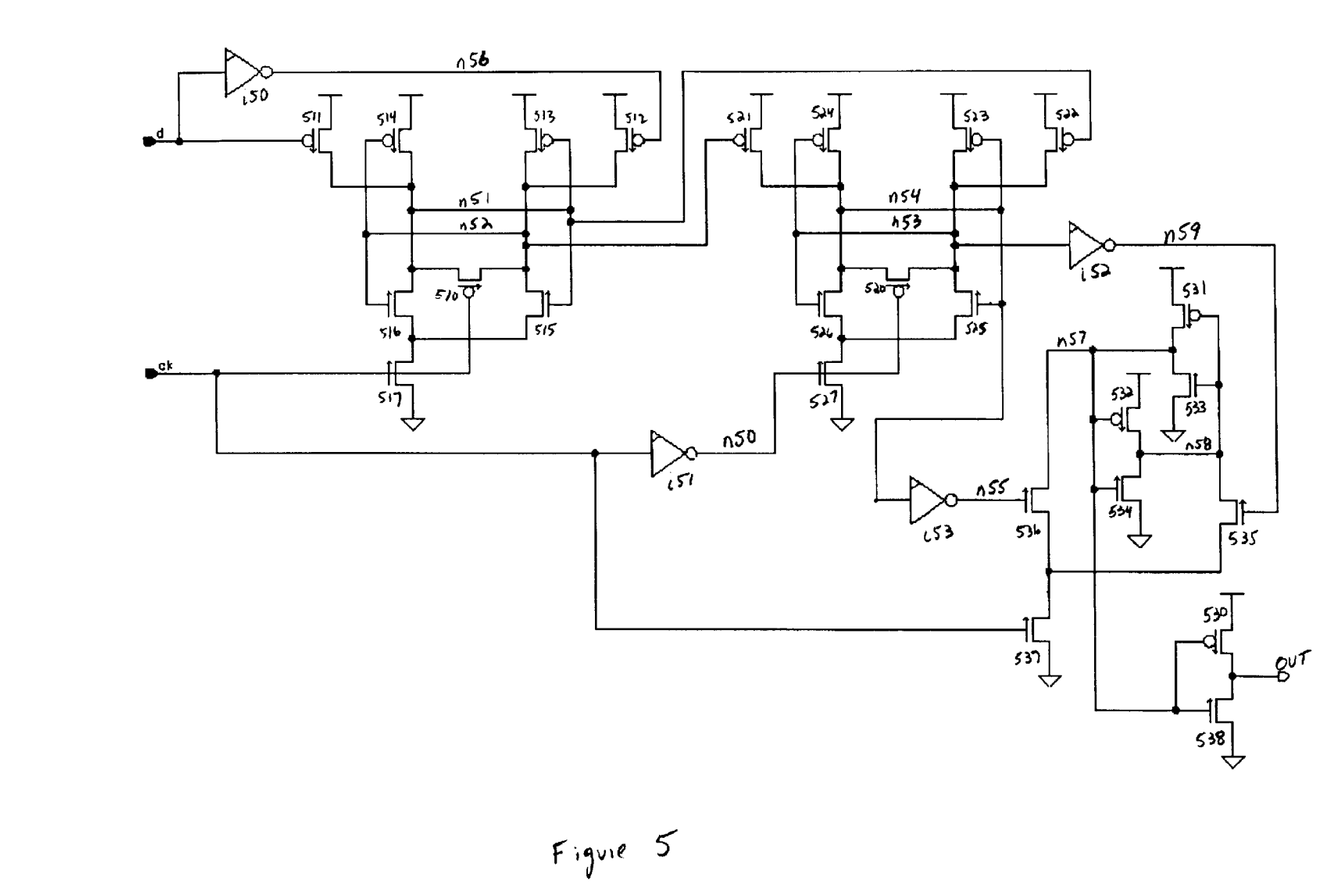
FIG. 5 shows, in greater detail, an exemplary embodiment of the present invention utilizing an additional sense amp latch.

FIG. 5 is a transistor level diagram illustrating an exemplary embodiment of the present invention utilizing the dual sense amp latch, jam latch, and novel clocking scheme design. The first sense amp latch (SAL1) is comprised of PMOS transistors 510–514 and NMOS transistors 515–517. The second sense amp latch (SAL2) is comprised of PMOS transistors 520–524 and NMOS transistors 525–527. The jam latch is comprised of PMOS transistors 530–532 and NMOS transistors 533–538. The operation of SAL2 and the jam latch is similar to the embodiment depicted in FIG. 3. SAL1 operates similar to SAL2 except that its supplied clock signal ck is not inverted as compared to the jam latch. As such, input data signal d is latched in SAL1 on the rising edge of a clock signal ck, transferred to SAL2 on the falling edge of clock signal ck, and displayed on the next rising edge of clock signal ck. A detailed description of the present invention exhibiting this behavior during pertinent clock phases is described below.

With clock signal ck low, SAL1 precharges in a similar fashion as the sense amp latch circuitry of FIG. 2a during its high clock phase. Nodes n51 and n52 are shorted circuited via transistor 510 which has been turned on by the low clock signal. Transistors 515 and 516 do not conduct since transistor 517 has been turned off by the low clock signal. As a result, nodes n51 and n52 are allowed to float high with the incoming input data signal. Upon input data signal d going high while clock signal ck is low, node n56 is caused to go low by inverter i50 and node n52 is pulled high by transistor 512. Likewise, upon input data signal d going low while clock signal ck is low, node n51 is pulled high by transistor 511 which has been turned on by low input data signal d.

Upon clock signal ck rising, transistor 510 is turned on thereby removing the short circuit between nodes n52 and n51 which enables them to be differentiated depending upon the current value of input data signal d. If input data signal d is currently high, node n51 is pulled low via transistors 526 and 517 which have been turned on by the high clock signal ck thereby allowing node n52 to remain high. Likewise, if input data signal d is currently low, node n52 is pulled low via transistors 515 and 517 allowing node n51 to remain high. The differential formed across nodes n51 and n52 is driven to SAL2 where it is received by transistors 521 and 522 which impact output nodes n53 and n54. However, nodes n54 and n53 of SAL2 remain short circuited via transistor 520 which has been turned on by the inverted clock signal delivered to node n50 via inverter i51. Furthermore, nodes n53 and n54 are allowed to float high via transistor 527 which has been turned off by the inverted clock signal. Thus, as clock signal ck rises, input data signal d is latched in SAL1, the transfer of data is delayed as SAL2 precharges, and any metastability of the latched data may continue to be resolved.

Upon clock signal ck falling, inverter i51 causes node n50 to go high which turns off transistor 520 thereby removing the short circuit between nodes n54 and n53 and allowing data latched in SAL1 to be transferred to SAL2. If SAL1 has latched a high data value (n51 low and n52 high), node n53 is pulled high by transistor 522 causing transistor 526 to turn on thereby pulling node n54 low via transistor 527 which as been turned on by the inverted clock signal on node n50. Likewise, if SAL1 has latched a low data value (n51 high and n52 low), node 54 is pulled high by transistor 521 causing transistor 525 to turn on thereby pulling node n53 low via transistor 527. The differential across nodes n53 and n54 is then fed to inverters i52 and i53 which deliver the inverted value of the differential to transistors 535 and 536 via nodes n59 and n55 respectively. However, with transistor 537 turned off by the low clock signal, transistors 535 and 536 do not conduct thereby preserving the previously stored value in the jam latch. Hence with clock signal ck low, data from SAL1 is latched in SAL2 while transparency of the data in regards to the jam latch is delayed.

Upon clock signal ck rising to a high value again, transistor 537 is turned on allowing either transistor 535 or transistor 536 to conduct depending upon the differential value delivered by inverters i52 and i53 to nodes n59 and n55 respectively. This action causes the cross-coupled inverters comprised of transistors 531–534 to pull either node n57 or n58 low with the other node high which causes a high or low value respectively to appear on output OUT via transistors 530 and 538 which providing an inverter function. Hence as clock signal ck goes high again, data latched in SAL2 is transferred to the jam latch and displayed on output OUT.

Addition of still further sense amplifier latches may provide further improvement in synchronization and metastability resolution characteristics. Each additional sense amplifier latch added may increase the allowable settling time and improve the MTBF of the device thereby reducing the failure rate. Furthermore, such increased settling time may be advantageously added in half cycles increments.

What is claimed is:

1. A device for resolving metastability comprising:
   at least one master latch, wherein the at least one master latch receives a data signal and resolves a metastability condition of the data signal to generate a stable data signal; and
   a slave latch, wherein the slave latch receives the stable data signal resolved by the at least one master latch and displays the stable data signal;
   wherein the slave latch receives a complementary clock signal with respect to the at least one master latch and the metastability condition is resolved by extending a setup time before the data signal is received at the slave latch.

2. The device according to claim 1, wherein the at least one master latch resolves the metastability condition of the data signal on a first clock phase and the slave latch receives and displays the stable data signal on a second clock phase.

3. The device according to claim 2, wherein the first clock phase is maximized to allow the master latch to perform the resolution.

4. A device for resolving metastability comprising:
   at least one master latch, wherein the at least one master latch receives a data signal and resolves a metastability condition of the data signal to generate a stable data signal; and
   a slave latch, wherein the slave latch receives the stable data signal resolved by the at least one master latch and displays the stable data signal;
   wherein:
      the metastability condition is resolved by extending a setup time before the data signal is received at the slave latch;

the at least one master latch resolves the metastability condition of the data signal on a first clock phase and the slave latch receives and displays the stable data signal on a second clock phase;

the first clock phase is maximized to allow the master latch to perform the resolution; and the first clock phase initiates on a falling edge of a clock pulse and the second clock phase initiates on a rising edge of the clock pulse.

5. The device according to claim 4, wherein the clock pulse occurs at a duration less than a 50 per cent duty cycle.

6. A device for resolving metastability comprising:

at least one master latch, wherein the at least one master latch receives a data signal and resolves a metastability condition of the data signal to generate a stable data signal; and a slave latch, wherein the slave latch receives the stable data signal resolved by the at least one master latch and displays the stable data signal;

wherein the metastability condition is resolved by extending a setup time before the data signal is received at the slave latch; and wherein the slave latch is associated with a first metastability time resolution constant and the master latch being associated with a second metastability time resolution constant, the second metastability time resolution constant being less than the first metastability time resolution constant.

7. The device according to claim 1, wherein the at least one master latch is a sense amp latch.

8. A device for resolving metastability comprising:

at least one master latch, wherein the at least one master latch receives a data signal and resolves a metastability condition of the data signal to generate a stable data signal; and a slave latch, wherein the slave latch receives the stable data signal resolved by the at least one master latch and displays the stable data signal;

wherein the metastability condition is resolved by extending a setup time before the data signal is received at the slave latch, the at least one master latch is a sense amp latch, and the sense amp latch includes a sense amplifier circuit and a plurality of cross-coupled CMOS inverters.

9. A device for resolving metastability comprising:

at least one master latch, wherein the at least one master latch receives a data signal and resolves a metastability condition of the data signal to generate a stable data signal; and a slave latch, wherein the slave latch receives the stable data signal resolved by the at least one master latch and displays the stable data signal;

wherein the metastability condition is resolved by extending a setup time before the data signal is received at the slave latch, the at least one master latch is a sense amp latch, and the slave latch is a jam latch.

10. A device for resolving metastability comprising:

at least one master latch, wherein the at least one master latch receives a data signal and resolves a metastability condition of the data signal to generate a stable data signal; and a slave latch, wherein the slave latch receives the stable data signal resolved by the at least one master latch and displays the stable data signal;

wherein the metastability condition is resolved by extending a setup time before the data signal is received at the slave latch, the at least one master latch is a sense amp latch, and the slave latch is a tri-stable latch.

11. A method for resolving metastability comprising:

receiving a data signal having a metastable condition;

resolving the metastable condition of the received data signal in at least one master latch to produce a stable data signal;

receiving the stable data signal in a slave latch; and displaying the stable data signal;

wherein the slave latch receives a complementary clock signal with respect to the at least one master latch, and the metastable condition is resolved by extending a setup time before the data signal is received at the slave latch.

12. The method according to claim 11, further comprising:

controlling the at least one master latch and the slave latch via a clock signal, wherein the metastable condition of the received data signal is resolved during a first phase of the clock signal and the stable data signal is displayed on a second phase of the clock signal.

13. The method according to claim 12, wherein the first phase is maximized.

14. A method for resolving metastability comprising:

receiving a data signal having a metastable condition;

resolving the metastable condition of the received data signal in at least one master latch to produce a stable data signal;

receiving the stable data signal in a slave latch;

displaying the stable data signal; and controlling the at least one master latch and the slave latch via a clock signal;

wherein:
the metastable condition is resolved by extending a setup time before the data signal is received at the slave latch;

the metastable condition of the received data signal is resolved during a first phase of the clock signal and the stable data signal is displayed on a second phase of the clock signal;

the first phase is maximized; and the first phase initiates on a falling edge of a clock pulse of the clock signal and the second phase initiates on a rising edge of the clock pulse.

15. The method according to claim 14, wherein the clock pulse occurs at a duration less than a 50 per cent duty cycle.

16. The method according to claim 11, wherein the at least one master latch is a sense amp latch.

17. A method for resolving metastability comprising:

receiving a data signal having a metastable condition;

resolving the metastable condition of the received data signal in at least one master latch to produce a stable data signal;

receiving the stable data signal in a slave latch; and displaying the stable data signal;

wherein:
the metastable condition is resolved by extending a setup time before the data signal is received at the slave latch;

the at least one master latch is a sense amp latch; and the sense amp latch includes a sense amplifier circuit and a plurality of cross-coupled CMOS inverters.

18. A method for resolving metastability comprising:

receiving a data signal having a metastable condition;

resolving the metastable condition of the received data signal in at least one master latch to produce a stable data signal;
receiving the stable data signal in a slave latch; and
displaying the stable data signal;
wherein:
the metastable condition is resolved by extending a setup time before the data signal is received at the slave latch;
the at least one master latch is a sense amp latch; and
the slave latch is a jam latch.

19. A method for resolving metastability comprising:
receiving a data signal having a metastable condition;
resolving the metastable condition of the received data signal in at least one master latch to produce a stable data signal;
receiving the stable data signal in a slave latch; and
displaying the stable data signal;
wherein:
the metastable condition is resolved by extending a setup time before the data signal is received at the slave latch;
the at least one master latch is a sense amp latch; and
the slave latch is a tri-stable latch.

20. A flip flop comprising:
a slave latch, wherein the slave latch is associated with a first metastability time resolution constant;
a master latch, wherein the master latch is associated with a second metastability time resolution constant, the second metastability time resolution constant being lower than the first metastability time resolution constant;
a clocking circuit, wherein a metastable condition is resolved in the slave latch and the clocking circuit controls an amount of time data is allowed to resolve in the master latch.

21. The flip flop according to claim 20, wherein the master latch captures data on a first phase of a clock signal of the clocking circuit and the output of the slave latch is displayed on a second phase of the clock signal.

22. The flip-flop of claim 20, wherein the master latch is a sense amp latch.

23. The flip-flop of claim 22, wherein the sense amp latch includes a sense amplifier circuit and cross-coupled CMOS inverters.

24. The flip-flop of claim 20, wherein the slave latch is a jam latch.

25. The flip-flop of claim 24, wherein the jam latch is a tri-stable latch.

26. The flip-flop of claim 20, wherein the first phase is maximized.

* * * * *